United States Patent
Zheng et al.

(10) Patent No.: US 10,409,407 B2
(45) Date of Patent: Sep. 10, 2019

(54) TOUCH PANEL AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Qitao Zheng, Beijing (CN); Ming Hu, Beijing (CN); Ming Zhang, Beijing (CN); Yu Zhu, Beijing (CN); Shifeng Xu, Beijing (CN); Xinbin Tian, Beijing (CN); Tong Chen, Beijing (CN); Chunjian Liu, Beijing (CN); Jing Wang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/742,759

(22) PCT Filed: Jul. 13, 2017

(86) PCT No.: PCT/CN2017/092682
§ 371 (c)(1),
(2) Date: Jan. 8, 2018

(87) PCT Pub. No.: WO2018/024085
PCT Pub. Date: Feb. 8, 2018

(65) Prior Publication Data
US 2018/0373368 A1 Dec. 27, 2018

(30) Foreign Application Priority Data

Aug. 2, 2016 (CN) .................... 2016 2 0828718 U

(51) Int. Cl.
*G06F 3/041* (2006.01)
*G06F 3/044* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC .... G06F 3/0412; G06F 3/047; G02F 1/13338; H01L 27/323
See application file for complete search history.

(56) References Cited

U.S. PATENT DOCUMENTS

2011/0169783 A1 7/2011 Wang et al.
2016/0147346 A1 5/2016 Lee et al.

FOREIGN PATENT DOCUMENTS

CN 103092411 A 5/2013
CN 103744565 A 4/2014
(Continued)

OTHER PUBLICATIONS

Liu et al., CN 103744565 A machine translation, Jan. 8, 2014.*
Sep. 27, 2017—(WO) International Search Report and Written Opinion Appn PCT/CN2017/092682 with English Tran.

*Primary Examiner* — Peter D McLoone
(74) *Attorney, Agent, or Firm* — Banner & Witcoff, Ltd.

(57) ABSTRACT

A touch panel, including a base substrate and a touch structure disposed on the base substrate, the touch structure disposed in a central area of the base substrate and in a portion of a peripheral area adjacent to the central area; the touch panel further including a light blocking layer disposed in the peripheral area and a first over coating layer at least covering the light blocking layer; wherein the first over
(Continued)

coating layer is disposed between the light blocking layer and the touch structure. A display device is further disclosed.

16 Claims, 4 Drawing Sheets

(51) Int. Cl.
*H01L 27/32* (2006.01)
*G02F 1/1333* (2006.01)
*G06F 3/047* (2006.01)

(52) U.S. Cl.
CPC .............. *G06F 3/047* (2013.01); *H01L 27/32* (2013.01); *G06F 2203/04103* (2013.01); *G06F 2203/04107* (2013.01); *G06F 2203/04111* (2013.01); *H01L 27/323* (2013.01)

(56) References Cited

FOREIGN PATENT DOCUMENTS

| CN | 105260063 A | 1/2016 |
| CN | 105630230 A | 6/2016 |
| CN | 206258846 U | 6/2017 |

* cited by examiner

TOUCH PANEL AND DISPLAY DEVICE

The application is a U.S. National Phase Entry of International Application No. PCT/CN2017/092682 filed on Jul. 13, 2017, designating the United States of America and claiming priority to Chinese Patent Application No. 201620828718.4 filed on Aug. 2, 2016. The present application claims priority to and the benefit of the above-identified applications and the above-identified applications are incorporated by reference herein in their entirety.

TECHNICAL FIELD

Embodiments of the present disclosure relate to a touch panel and a display device.

BACKGROUND

With the development of display technology, touch panel technology has entered a period of rapid development. As the capacitive touch screen has characters of precise positioning, touch feel good and long life and so on, it has been paid more and more attention.

One Glass Solution (OGS) technology refers to a touch structure formed on a cover glass. The cover glass plays the protection function and the touch function at the same time. In such a structure, a light blocking layer is also formed in a peripheral area of the cover glass and is configured for blocking light and for decoration.

Currently, as shown in FIG. 1, in order to increase the touch effect at the edge of the central area 01 of the display device, the touch structure 10 is disposed not only in the central area 01 but also in a portion of the peripheral area 02 adjacent to the central area 01. However, such a configuration will cause a portion of the touch structure 10 in the peripheral area 02 overlap a light blocking layer (not shown in FIG. 1) disposed in the peripheral area 02. As the light blocking layer comprises conductive elements which has a function of conduct electricity, electro-static discharge (ESD) easily occurs in the peripheral area 02 of the cover glass, causing the performance of the cover glass to be degraded or even destroyed, thereby reducing the product yield.

SUMMARY

At least one embodiment of the present disclosure provides a touch panel, comprising a base substrate and a touch structure disposed on the base substrate, the touch structure disposed in a central area of the base substrate and in a portion of a peripheral area adjacent to the central area; the touch panel further comprising a light blocking layer disposed in the peripheral region and a first over coating layer at least covering the light blocking layer; wherein the first over coating layer is disposed between the light blocking layer and the touch structure.

In one embodiment of the present disclosure, the first over coating layer further comprises a portion in the central area, and a distance between an edge of the first over coating layer in the central area and an edge of the central region adjacent to the first over coating layer is less than 50 μm.

In one embodiment of the present disclosure, the touch structure comprises a plurality of first touch electrodes and a plurality of second touch electrodes which are crossing each other and insulated from each other, and the first touch electrode are electrically connected through a connecting wire in a crossing area of the first touch electrodes and the second touch electrodes.

In one embodiment of the present disclosure, the connecting wire is disposed between the second touch electrode and the base substrate, and the connecting wire is insulated from the second touch electrode through an insulating block, wherein the insulating block is disposed in the same level as the first over coating layer.

In one embodiment of the present disclosure, the connecting wire is disposed on a side of the second touch electrode away from the base substrate; the connecting wire 103 is insulated form the second touch electrode by means of the insulating block, and the touch panel further comprises a metal wiring disposed in the peripheral area; and wherein the connecting wire is made of a metal material, and the connecting wire is disposed in the same level as the metal wiring.

In one embodiment of the present disclosure, the touch panel further comprises a second over coating layer disposed on a side of the metal wiring away from the substrate and covering the metal wiring.

In one embodiment of the present disclosure, the touch panel further comprise a third over coating layer disposed in the central area and the peripheral area and located at a side of the light blocking layer away from the substrate and in contact with the light blocking layer.

In one embodiment of the present disclosure, the light blocking layer is a white light blocking layer or a black light blocking layer.

In one embodiment of the present disclosure, the light blocking layer comprises a conductive element.

At least one embodiment of the present disclosure provides a display device, comprising the touch panel mentioned above.

In one embodiment of the present disclosure, the display device further comprises a display panel, which is a liquid crystal display panel or an OLED display device.

In the touch panel and the display device according to the embodiments of the present disclosure, the first over coating layer is disposed in the peripheral area and between the light blocking layer and the touch structure and covers the light blocking layer, so as to insulate the light blocking layer and the touch structure. As the over coating layer comprises no conductive elements, ESD resistance capability can be effectively enhanced in the peripheral area, thereby improving product yield.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS

01—Central Area
02—Peripheral Area
03—Touch Panel
04—Display Panel
05—OCR
10—Touch Structure
20—Light Blocking Layer
30—First Over Coating Layer
50—Second Over Coating Layer
40—Third Over Coating Layer
100—Base Substrate
101—First Touch Electrode
102—Second Touch Electrode
103—Connecting Wire
104—Insulating Block
105—Metal Wiring

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 2:
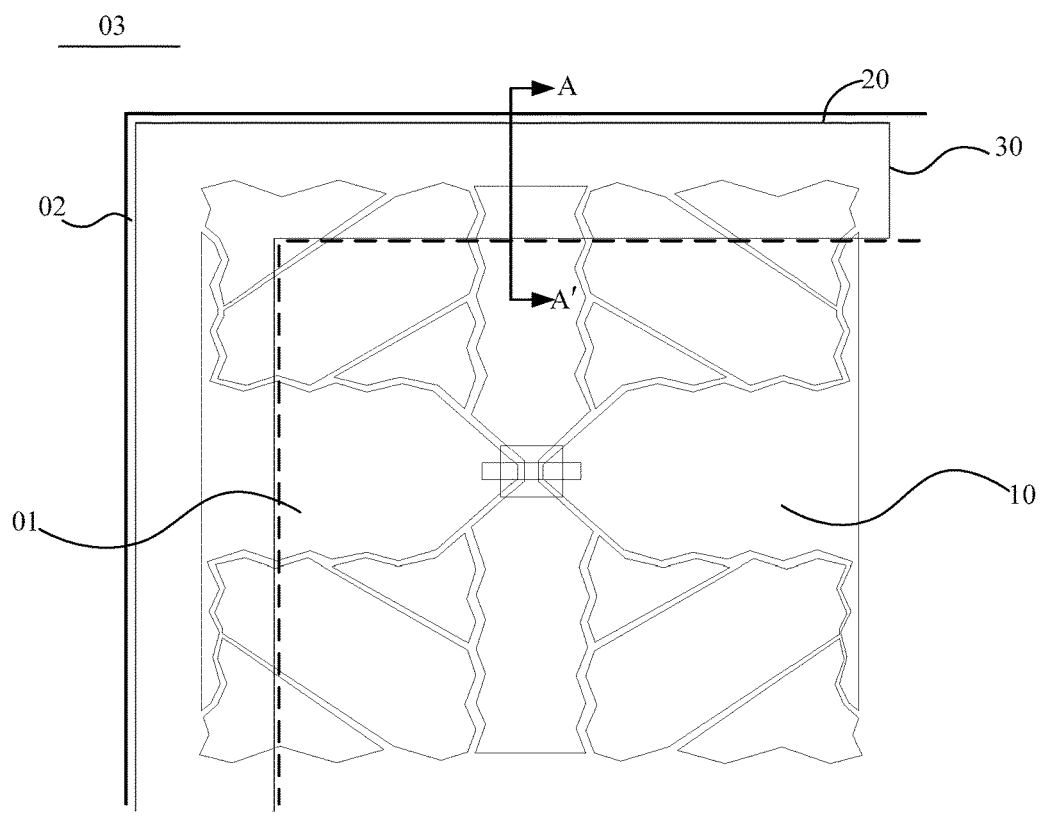
FIG. 2 illustrates a first schematic top view of a touch panel according to an embodiment of the present disclosure.
Figure 3:
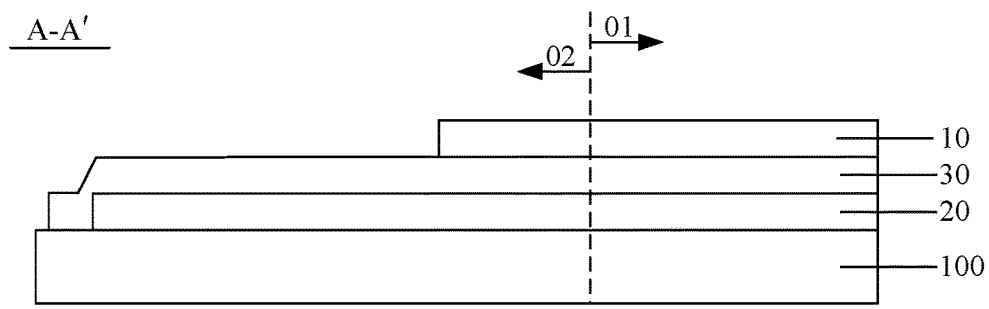
FIG. 3 illustrates a cross-sectional view taken along line AA' in FIG. 2.

At least one embodiment of the present disclosure provides a touch panel 03. As illustrated in FIG. 2 and FIG. 3, the touch panel 03 comprises a base substrate 100 and a touch structure 10 disposed on the base substrate 100; the touch structure 10 is disposed in a central area 01 of the base substrate 100 and in a portion of a peripheral area 02 adjacent to the central area 01; the touch panel 03 further comprises a light blocking layer 20 disposed in the peripheral region 02 and a first over coating (OC) layer 30 at least covering the light blocking layer 20; wherein the light blocking layer 20 comprises conductive elements, and the first over coating layer 30 is disposed between the light blocking layer 20 and the touch structure 10.

Figure 1:
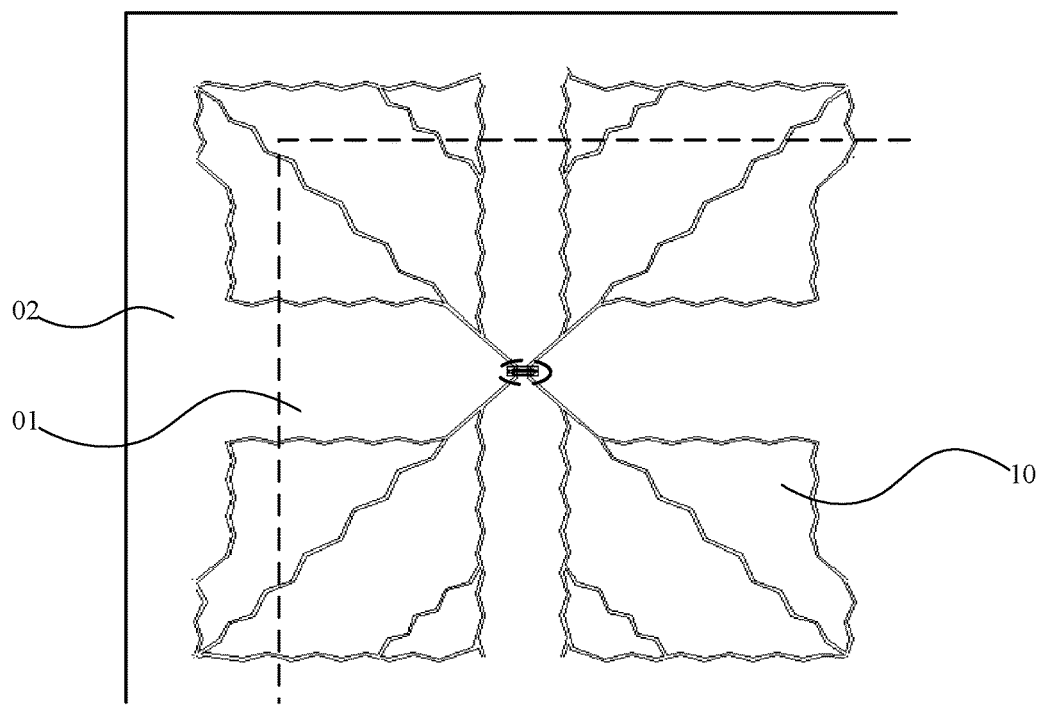
FIG. 1 shows a plan view of a cover glass according to the conventional art.

It should be noted that, firstly, a structure of the touch structure 10 is not limited in the present disclosure as long as the touch control function can be realized and the touch structure 10 illustrated in FIG. 1 is merely illustrative; secondly, the central area 01 described herein is an area used for displaying images when the touch panel 03 is applied to a display device and the peripheral area 02 is located at the periphery of the central area 01; thirdly, the first over coating layer 30 at least covering the light blocking layer 20 means that projection of the light blocking layer 20 on the base substrate 100 completely falls within projection of the first coating layer 30 on the base substrate 100; and fourthly, the base substrate 100 can be a transparent base substrate, for example.

In the touch panel 03 according to the embodiments of the present disclosure, the first over coating layer 30 is disposed in the peripheral area 02 and between the light blocking layer 20 and the touch structure 10 and covers the light blocking layer 20, so as to insulate the light blocking layer and the touch structure 10. As the over coating layer 30 comprises no conductive elements, ESD resistance capability can be effectively enhanced in the peripheral area 02, thereby improving product yield.

Figure 4:
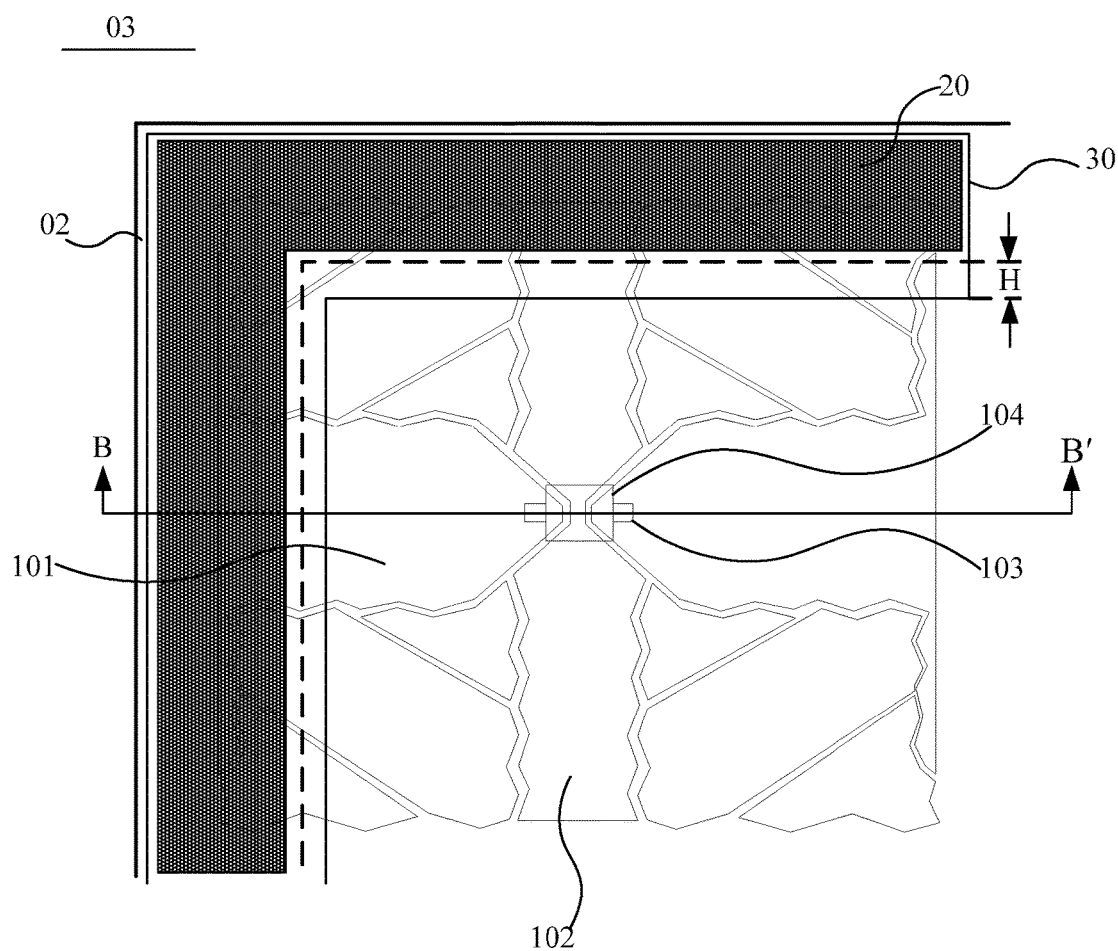
FIG. 4 illustrates a second schematic top view of a touch panel according to one embodiment of the present disclosure.

For example, as illustrated in FIG. 4, the first over coating layer 30 further comprises a portion in the central area 01 and a distance H between an edge of the first over coating layer 30 in the central area 01 and an edge of the central region 01 adjacent to the first over coating layer 30 is less than 50 µm.

For example, the distance H can be in a range of 10 µm to 50 µm. The distance can be 20 µm, 30 µm, 40 µm, 50 µm, and the like.

Due to a overall greater thickness of the first over coating layer 30 and the light blocking layer 20 in the peripheral area 02, there is a higher level difference between the peripheral area 02 and the central area 01. By extending the first over coating layer to the central area 01, the level difference generated due to the first over coating layer 30 and the light blocking layer 20 can be smoothly mitigated, thereby reducing difficulties in subsequent processes.

On this basis, the distance H is set to be 50 µm or less, the touch structure 10 can be covered by the first over coating layer 30 as little as possible so as to avoid influence on the touch performance.

Figure 5:
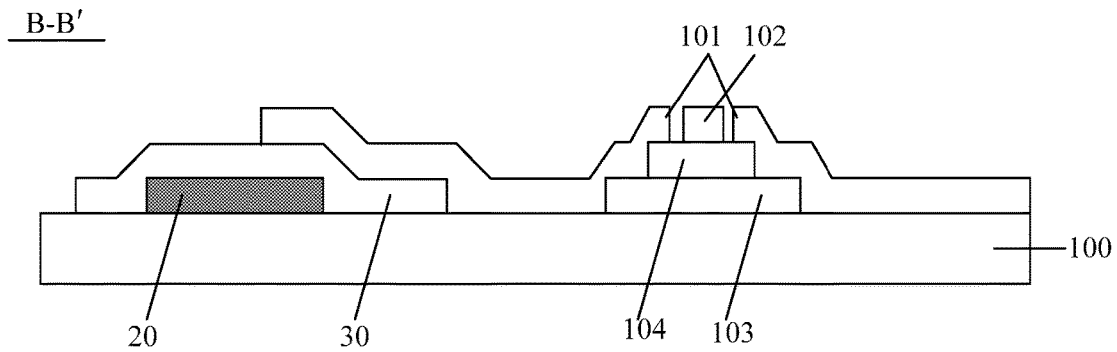
FIG. 5 illustrates a first schematic cross-sectional view taken along BB' in FIG. 4.

As illustrated in FIG. 4 and FIG. 5, the touch structure 10 comprises a first touch electrode 101 and a second touch electrode 102 which are crossed and insulated from each other. The first touch electrode 101 or the second touch electrode 102 is electrically connected through a connecting wire 103 in a crossing area of the first touch electrode 101 and the second touch electrode 102.

It should be noted that, the first touch electrode 101 and the second touch electrode 102 can be disposed on the same level, or can be disposed on different levels. If the first touch electrode 101 and the second touch electrode 102 are disposed on the same level, the first touch electrode 101 or the second touch electrode 102 can be electrically connected through a connecting wire 103 in the crossing area.

FIG. 4 and FIG. 5 are depicted by taking as an example that the first touch electrode 101 is electrically connected through the connecting wire 103 in the crossing area.

And further, as illustrated in FIG. 4 and FIG. 5, the connecting wire 103 is disposed between the second touch electrode 102 and the base substrate 100, and the connecting wire 103 is insulated from the second touch electrode 102 through an insulating block 104, wherein the insulating block 104 is disposed in the same level as the first over coating layer 30.

Based on this, both the first touch electrode 101 and the second touch electrode 102 are made of a transparent conductive material such as ITO, IZO and the like.

It should be noted that, the insulating block 104 disposed in the same level as the first over coating layer 30 means that the insulating block 104 and the first over coating layer 30 are formed in a single patterning process.

Through forming the insulating block 104 and the first over coating layer 30 in a single patterning process, the number of patterning processes used for manufacturing the touch panel can be reduced, and the opening ratio can be increased.

And further, after forming the first touch electrode 101 and the second touch 102, a metal wiring which is respectively connected to the first touch electrode 101 and the second touch electrode 102 can be form. The metal wiring is configured to be connected to an integrated circuit (IC).

And further, the touch panel 03 can further comprise a second over coating layer (not shown in the figures) disposed on a side of the metal wiring away from the substrate 100. That is, after forming the metal wiring, a second over coating layer is formed in the peripheral area 02, and the second over coating layer covers the metal wiring.

The metal wiring can be protected by providing the second over coating layer.

Figure 6:
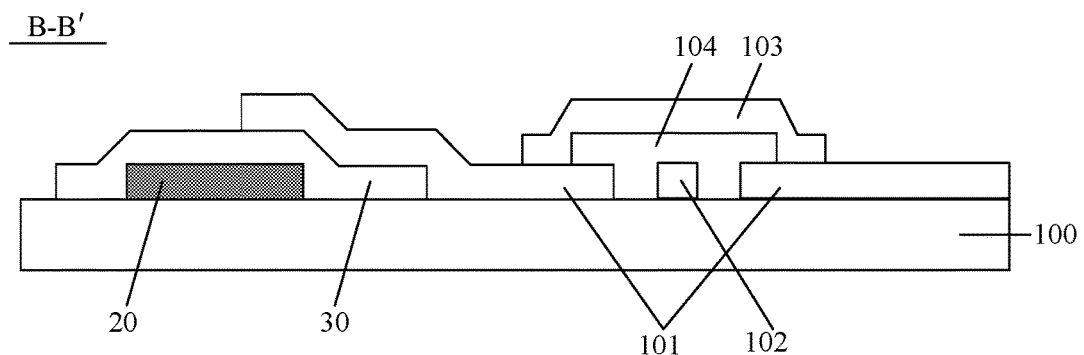
FIG. 6 illustrates a second schematic cross-sectional view taken along BB' in FIG. 4.

In an embodiment of the present disclosure, as illustrated in FIG. 4 and FIG. 6, the connecting wire 103 is disposed on a side of the second touch electrode 102 away from the base substrate 100; the connecting wire 103 is insulated form the second touch electrode 102 by means of the insulating block 104. Wherein the touch panel 03 further comprises a metal wiring 105 disposed in the peripheral area 02, material of the connecting wire 103 is a metal material, and the connecting wire 103 is disposed in the same level as the metal wiring 105. In implementation, the connecting wire 103 and the metal wiring 105 can be formed through one single patterning process. By forming the connecting wire 103 and the metal wire 105 through one single patterning process, the number of patterning processes can be reduced.

Figure 7:
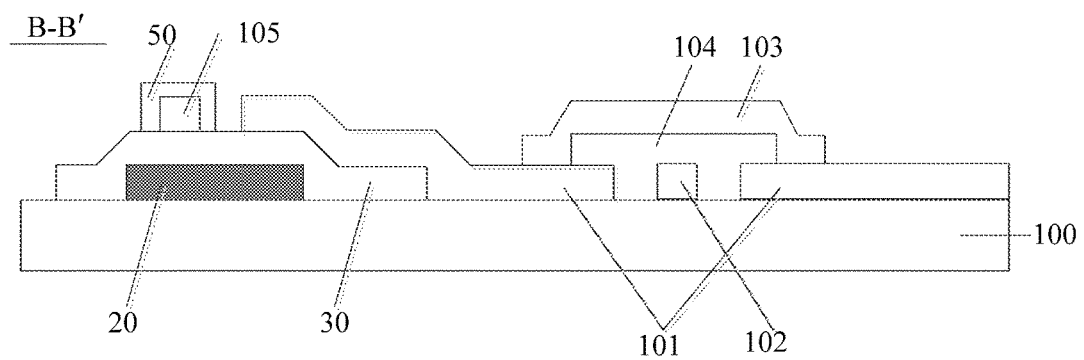
FIG. 7 illustrates a third schematic cross-sectional view taken along BB 'in FIG. 4.

And further, as illustrated in FIG. 7, the touch panel 03 further comprises a second over coating layer 50 disposed on a side of the metal wiring away from the base substrate 100. That is, after forming the metal wiring 105, a second over coating layer 50 is formed in the peripheral area 02, and the second over coating layer covers the metal wiring 105.

The metal wiring 105 can be protected by providing the second over coating layer.

Figure 8:
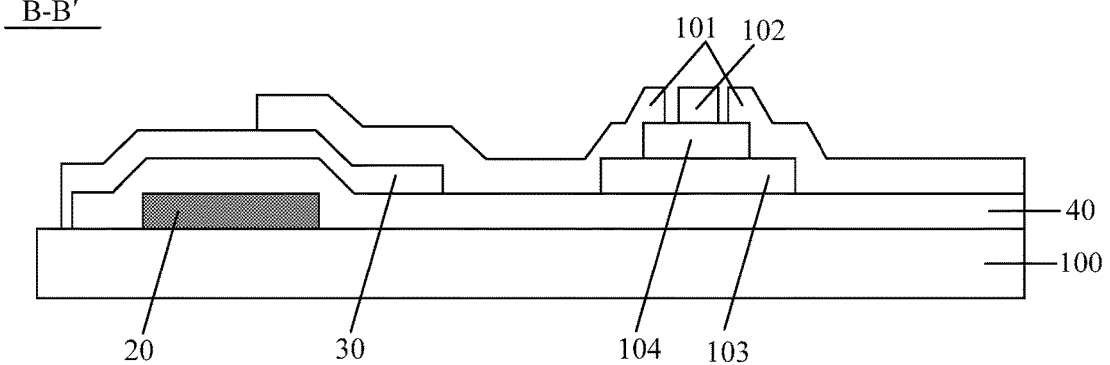
FIG. 8 illustrates a forth schematic cross-sectional view taken along BB' in FIG. 4.

In an embodiment of the present disclosure, as illustrated in FIG. 8, the touch panel 03 further comprises a third over coating layer 40 disposed in the central area 01 and the peripheral area 02 and located at a side of the light blocking layer 20 away from the substrate 100 and in contact with the light blocking layer 20. The strength of the base substrate 100 can be enhanced by providing the third over coating layer 40.

Considering that the frame of the electronic device typically is white or black, the light blocking layer 20 is selected to be white or black.

At least one embodiment of the present disclosure further provides a display device, which comprises the touch panel 03 described above.

The display device can be any product or any component having display and touch function, such as a monitor, a television set, a cell phone, a tablet PC, and etc.

In the display device according to the embodiments of the present disclosure, the first over coating layer 30 is disposed in the peripheral area 02 of the touch panel 03 and located between the light blocking layer 20 and the touch structure 10, and the first over coating layer 30 covers the light blocking layer 20, so that the light blocking layer 20 and the touch structure 10 can be isolated from each other. As the first over coating layer 30 is free of conductive elements, the anti-ESD capacity of the peripheral region 02 can effectively improve, thereby improving the product yield.

Figure 9:
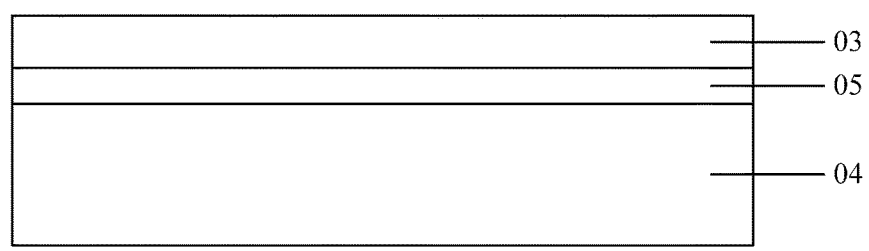
FIG. 9 illustrates a schematic structural view of a display device according to one embodiment of the present disclosure.

In an embodiment of the present disclosure, as illustrated in FIG. 9, the display device further comprises a display panel 04, and the touch panel 03 is disposed on a light-emitting side of the display panel 04.

For example, the display panel 04 and the touch panel 03 can be bonded to each other through an optical clear resin (OCR) 05.

When the display panel 04 is a liquid crystal display panel, the display panel 04 comprises an array substrate, a counter substrate, and a liquid crystal layer disposed therebetween. The array substrate can comprise a thin film transistor (TFT), a pixel electrode electrically connected to the drain of the TFT, and further comprise a common electrode. The counter substrate can comprise a black matrix and a color filter. Additionally, the color filter can be disposed on the counter substrate or can be disposed on the array substrate. The common electrode can be disposed on the array substrate or can be disposed on the counter substrate.

When the display panel 04 is an OLED (Organic Light Emitting Diode) display panel, the display panel 04 comprises an array substrate and a package substrate. The array substrate can comprise a TFT, an anode electrically connected to a drain of the TFT, a cathode, and an organic functional material layer located between the anode and the cathode.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201620828718.4 filed on Aug. 2, 2016, the disclosure of which is hereby entirely incorporated by reference.

The invention claimed is:

1. A touch panel, comprising:
a base substrate and a touch structure disposed on the base substrate, wherein the touch structure is disposed in a central area of the base substrate and in a portion of a peripheral area adjacent to the central area;
a light blocking layer disposed in the peripheral area; and
a first over coating layer at least covering the light blocking layer,
wherein the first over coating layer is disposed between the light blocking layer and the touch structure,
wherein the first over coating layer further comprises a portion in the central area, and a distance between an edge of the first over coating layer in the central area and an edge of the central area adjacent to the first over coating layer is less than 50 µm.

2. The touch panel according to claim 1, wherein the touch structure comprises a plurality of first touch electrodes and a plurality of second touch electrodes which are crossing each other and insulated from each other, and the first touch electrodes are electrically connected through a connecting wire in a crossing area of the first touch electrodes and the second touch electrodes.

3. The touch panel according to claim 2, wherein the connecting wire is disposed between the second touch electrodes and the base substrate, and the connecting wire is insulated from the second touch electrodes through an insulating block, wherein the insulating block is disposed in the same level as the first over coating layer.

4. The touch panel according to claim 2, wherein the connecting wire is disposed on a side of the second touch electrodes away from the base substrate, the connecting wire is insulated from the second touch electrodes by means of an insulating block, and the touch panel further comprises a metal wiring disposed in the peripheral area, wherein the connecting wire is made of a metal material, and the connecting wire is disposed in the same level as the metal wiring.

5. The touch panel according to claim 4, further comprising a second over coating layer disposed on a side of the metal wiring away from the base substrate and covering the metal wiring.

6. The touch panel according to claim 2, further comprising a third over coating layer disposed in the central area and the peripheral area and located at a side of the light blocking layer away from the base substrate and in contact with the light blocking layer.

7. The touch panel according to claim 2, wherein the light blocking layer is a white light blocking layer or a black light blocking layer.

8. The touch panel according to claim 2, wherein the light blocking layer comprises a conductive element.

9. The touch panel according to claim 1, further comprising a third over coating layer disposed in the central area and the peripheral area and located at a side of the light blocking layer away from the base substrate and in contact with the light blocking layer.

10. The touch panel according to claim 1, wherein the light blocking layer is a white light blocking layer or a black light blocking layer.

11. The touch panel according to claim 1, wherein the light blocking layer comprises a conductive element.

12. A display device, comprising the touch panel according to claim 1.

13. The display device according to claim 12, comprising a display panel which is a liquid crystal display panel or an OLED display device.

14. The touch panel according to claim 1, wherein the touch structure comprises a first touch electrode and a second touch electrode which are crossing and insulated from each other, and the first touch electrode is electrically connected to a connecting wire in a crossing area of the first touch electrode and the second touch electrode.

15. The touch panel according to claim 14, wherein the connecting wire is disposed between the second touch electrode and the base substrate, and the connecting wire is insulated from the second touch electrode through an insulating block, wherein the insulating block is disposed in the same level as the first over coating layer.

16. The touch panel according to claim 14, wherein the connecting wire is disposed on a side of the second touch electrode away from the base substrate, the connecting wire 103 is insulated from the second touch electrode by means of an insulating block, and the touch panel further comprises a metal wiring disposed in the peripheral area, wherein the connecting wire is made of a metal material, and the connecting wire is disposed in the same level as the metal wiring.

* * * * *